United States Patent
Kim et al.

(10) Patent No.: US 8,064,254 B2
(45) Date of Patent: Nov. 22, 2011

(54) COLUMNAR NON-VOLATILE MEMORY DEVICES WITH AUXILIARY TRANSISTORS AND METHODS OF OPERATING THE SAME

(75) Inventors: Suk-pil Kim, Gyeonggi-do (KR);
Yoon-dong Park, Gyeonggi-do (KR)

(73) Assignee: Samsung Electronics Co., Ltd. (KR)

( * ) Notice: Subject to any disclaimer, the term of this patent is extended or adjusted under 35 U.S.C. 154(b) by 368 days.

(21) Appl. No.: 12/493,935

(22) Filed: Jun. 29, 2009

(65) Prior Publication Data
US 2010/0067301 A1    Mar. 18, 2010

(30) Foreign Application Priority Data
Sep. 17, 2008 (KR) .................. 10-2008-0091257

(51) Int. Cl.
*G11C 11/34* (2006.01)
(52) U.S. Cl. ......... 365/185.05; 365/185.14; 365/185.18; 257/318
(58) Field of Classification Search ............ 365/185.05, 365/185.14, 185.18; 257/4, 318
See application file for complete search history.

(56) References Cited

U.S. PATENT DOCUMENTS

| 6,888,750 B2 * | 5/2005 | Walker et al. ............ 365/185.05 |
| 6,992,349 B2 * | 1/2006 | Lee et al. ..................... 257/324 |

FOREIGN PATENT DOCUMENTS

| JP | 10-093083 | 4/1998 |
| JP | 2007-180389 | 7/2007 |
| KR | 1019990067904 A | 8/1999 |

* cited by examiner

*Primary Examiner* — Son Dinh
(74) *Attorney, Agent, or Firm* — Myers Bigel Sibley & Sajovec, P.A.

(57) ABSTRACT

A non-volatile memory device includes at least one semiconductor column having a first sidewall and a second sidewall. The device also includes at least one gate electrode is disposed on the first sidewall and at least one control gate electrode disposed on the second sidewall. The device further includes at least one charge storage layer is disposed between the second sidewall and the at least one control gate electrode. The at least one gate electrode and the at least one control gate electrode may be disposed on opposite sides of the at least one semiconductor column such that they commonly control a channel region in the semiconductor column.

19 Claims, 11 Drawing Sheets

US 8,064,254 B2

COLUMNAR NON-VOLATILE MEMORY DEVICES WITH AUXILIARY TRANSISTORS AND METHODS OF OPERATING THE SAME

CROSS-REFERENCE TO RELATED APPLICATIONS

This application claims the benefit of Korean Patent Application No. 10-2008-0091257, filed on Sep. 17, 2008, in the Korean Intellectual Property Office, the disclosure of which is incorporated herein in its entirety by reference.

BACKGROUND

The present invention relates to semiconductor devices and, more particularly, to non-volatile semiconductor devices and methods of operating the same.

There is an increasing demand for semiconductor products that are smaller and have the capacity to process a large amount of data. Thus, integration of non-volatile memory devices used in semiconductor products has increased. In this regard, non-volatile semiconductor devices having a stack structure have been developed. However, it may be difficult to obtain operational reliability of such non-volatile semiconductor devices due to the scaling down of the features of the non-volatile semiconductor devices.

SUMMARY

According to some embodiments of the present invention, a non-volatile memory device includes at least one semiconductor column having a first sidewall and a second sidewall. The device also includes at least one gate electrode is disposed on the first sidewall and at least one control gate electrode disposed on the second sidewall. The device further includes at least one charge storage layer disposed between the second sidewall and the at least one control gate electrode. The at least one gate electrode and the at least one control gate electrode may be disposed on opposite sides of the at least one semiconductor column such that they commonly control a channel region in the semiconductor column.

The at least one charge storage layer may be positioned at a location where the at least one semiconductor column and the at least one control gate electrode cross. In further embodiments, the memory device may include at least one tunneling insulation layer disposed between the second sidewall and the at least one charge storage layer and at least one blocking insulation layer disposed between the at least one charge storage layer and the at least one control gate electrode. At least one gate insulation layer may be disposed between the first sidewall of the at least one semiconductor column and the at least one gate electrode.

In additional embodiments, the at least one gate electrode includes a plurality of gate electrodes that are spaced apart on the first sidewall of the at least one semiconductor column. The at least one control gate electrode may include a plurality of control gate electrodes that are spaced apart on the second sidewall of the at least one semiconductor column.

In some embodiments of the present invention, the at least one semiconductor column includes at least one row of semiconductor columns, each semiconductor column having a first sidewall and a second sidewall on opposite sides thereof. The at least one gate electrode includes at least one gate electrode disposed on the first sidewalls. The at least one control gate electrode includes at least one control gate electrode disposed on the second sidewalls. The at least one row of semiconductor columns is disposed between the at least one gate electrode and the at least one control gate electrode.

In additional embodiments, the at least one row of semiconductor columns includes a plurality of parallel rows of semiconductor columns. The at least one gate electrode includes respective gate electrodes disposed on the first sidewalls of respective ones of the rows of semiconductor columns. The at least one control gate electrode includes respective control gate electrodes disposed on the second sidewalls of respective ones of the rows of semiconductor columns. Adjacent ones of the rows of semiconductor columns may share a gate electrode and/or a control gate electrode.

In further embodiments, multiple levels of gate electrodes and control gate electrodes are disposed on the first and second sidewalls of each of the rows of semiconductor columns. A common gate line may be coupled in common to gate electrodes of multiple ones of the rows of semiconductor columns and a common control gate line may be coupled in common to control gate electrodes of multiple rows of the semiconductor columns.

According to some embodiments of the present invention, a non-volatile memory device includes at least one semiconductor column having a first sidewall and a second sidewall. A plurality of auxiliary transistors includes respective gate electrodes disposed on the first sidewalls of the at least one semiconductor column and configured to control respective channel regions of the at least one semiconductor column. A plurality of memory cells includes respective control gate electrodes and charge storage regions disposed on the second sidewalls. The control gate electrodes of respective ones of the plurality of memory cells control respective ones of the channel regions controlled by the gate electrodes of corresponding respective ones of the auxiliary transistors. The device further includes a plurality of auxiliary lines, respective ones of which are coupled to the gate electrodes of the plurality of auxiliary transistors, and a plurality of word lines, respective ones of which are coupled to the control gate electrodes of the plurality of memory cells. The plurality of memory cells may be connected in a NAND arrangement. In some embodiments, each of the plurality of memory cells includes a tunneling insulation layer disposed on the at least one semiconductor column, a charge storage layer disposed on the tunneling insulation layer, a blocking insulation layer disposed on the charge storage layer and a control gate electrode disposed on the blocking insulation layer.

Additional embodiments of the present invention provide methods of operating such non-volatile memory devices. A selected one of the plurality of memory cells is programmed by applying a program voltage to a control gate electrode of the selected one of the plurality of memory cells while non-selected ones of the plurality of memory cells are turned off and the respective auxiliary transistors corresponding to the non-selected memory cells are turned on. The auxiliary transistor corresponding to the selected memory cell may be turned off while the programming voltage is applied to the control gate electrode of the selected one of the plurality of memory cells. Data may be read from the selected one of the plurality of memory cells by applying a reference voltage to a control gate electrode of the selected one of the plurality of memory cells while non-selected ones of the plurality of memory cells are turned off and the auxiliary transistors corresponding to the non-selected ones of the plurality memory cells are turned on. The auxiliary transistor corresponding to the selected memory cell may be turned off while the reference voltage is applied to the control gate electrode of the selected one of the plurality of memory cells.

BRIEF DESCRIPTION OF THE DRAWINGS

Exemplary embodiments of the present invention will be more clearly understood from the following detailed description taken in conjunction with the accompanying drawings in which.

DETAILED DESCRIPTION OF THE EMBODIMENTS

Figure 1:
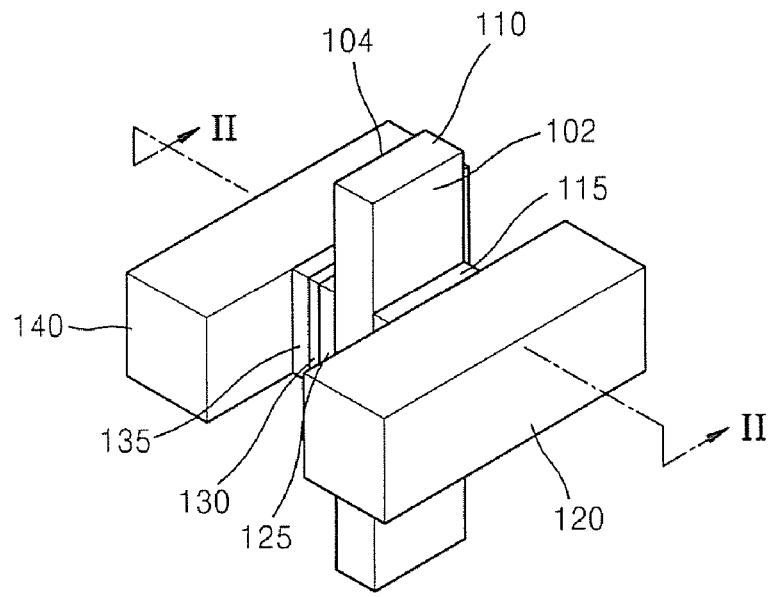
FIG. 1 is a perspective view of a non-volatile memory device according to some embodiments of the present invention.

The present invention now will be described more fully hereinafter with reference to the accompanying drawings, in which various embodiments are shown. However, this invention should not be construed as limited to the embodiments set forth herein. Rather, these embodiments are provided so that this disclosure will be thorough and complete, and will fully convey the scope of the invention to those skilled in the art. In the drawings, the thickness of layers and regions may be exaggerated for clarity. Like numbers refer to like elements throughout. As used herein the term "and/or" includes any and all combinations of one or more of the associated listed items and may be abbreviated as "/".

The terminology used herein is for the purpose of describing particular embodiments only and is not intended to be limiting of the invention. As used herein, the singular forms "a," "an" and "the" are intended to include the plural forms as well, unless the context clearly indicates otherwise. It will be further understood that the terms "comprises," "comprising," "having," "having," "includes," "including" and/or variations thereof, when used in this specification, specify the presence of stated features, regions, steps, operations, elements, and/or components, but do not preclude the presence or addition of one or more other features, regions, steps, operations, elements, components, and/or groups thereof.

It will be understood that when an element such as a layer or region is referred to as being "on" or extending "onto" another element (or variations thereof), it can be directly on or extend directly onto the other element or intervening elements may also be present. In contrast, when an element is referred to as being "directly on" or extending "directly onto" another element (or variations thereof), there are no intervening elements present. It will also be understood that when an element is referred to as being "connected" or "coupled" to another element (or variations thereof), it can be directly connected or coupled to the other element or intervening elements may be present. In contrast, when an element is referred to as being "directly connected" or "directly coupled" to another element (or variations thereof), there are no intervening elements present.

It will be understood that, although the terms first, second, etc. may be used herein to describe various elements, components, regions, layers and/or sections, these elements, materials, regions, layers and/or sections should not be limited by these terms. These terms are only used to distinguish one element, material, region, layer or section from another element, material, region, layer or section. Thus, a first element, material, region, layer or section discussed below could be termed a second element, material, region, layer or section without departing from the teachings of the present invention.

Relative terms, such as "lower", "back", and "upper" may be used herein to describe one element's relationship to another element as illustrated in the Figures. It will be understood that relative terms are intended to encompass different orientations of the device in addition to the orientation depicted in the Figures. For example, if the structure in the Figure is turned over, elements described as being on the "backside" of substrate would then be oriented on "upper" surface of the substrate. The exemplary term "upper", can therefore, encompasses both an orientation of "lower" and "upper," depending on the particular orientation of the figure. Similarly, if the structure in one of the figures is turned over, elements described as "below" or "beneath" other elements would then be oriented "above" the other elements. The exemplary terms "below" or "beneath" can, therefore, encompass both an orientation of above and below. However, as used herein, and as conventionally used, the "vertical" direction is generally orthogonal to the face of the substrate regardless of its orientation, whereas the "horizontal" direction is generally parallel to (extending along) the face of the substrate.

Embodiments of the present invention are described herein with reference to cross section and perspective illustrations that are schematic illustrations of idealized embodiments of the present invention. As such, variations from the shapes of the illustrations as a result, for example, of manufacturing techniques and/or tolerances, are to be expected. Thus, embodiments of the present invention should not be construed as limited to the particular shapes of regions illustrated herein but are to include deviations in shapes that result, for example, from manufacturing. For example, a region illustrated or described as flat may, typically, have rough and/or nonlinear features. Moreover, sharp angles that are illustrated, typically, may be rounded. Thus, the regions illustrated in the figures are schematic in nature and their shapes are not intended to illustrate the precise shape of a region and are not intended to limit the scope of the present invention.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Figure 2:
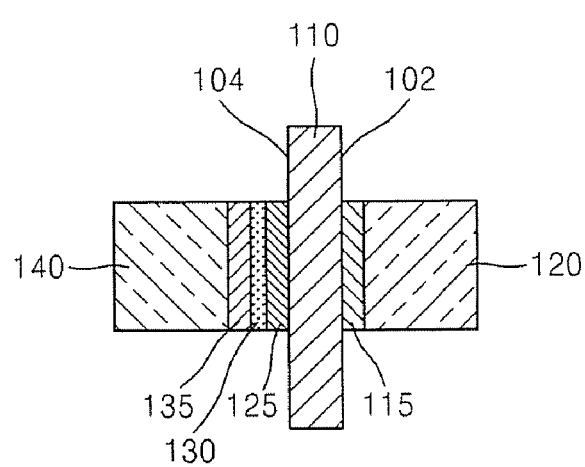
FIG. 2 is a cross-sectional view of the non-volatile memory device of FIG. 1 taken along a line II-II' in FIG. 1 according to some embodiments of the present invention.

FIG. 1 is a perspective view of a non-volatile memory device according to some embodiments of the present invention. FIG. 2 is a cross-sectional view of the non-volatile memory device of FIG. 1 taken along a line II-II' in FIG. 1.

Referring to FIGS. 1 and 2, the non-volatile memory device may include a semiconductor column 110 having a first sidewall 102 and a second sidewall 104. For example, the first sidewall 102 and the second sidewall 104 may be sidewalls on opposite sides of the column 110. The semiconductor column 110 may be used as a conductive channel for charge transfer. For example, the semiconductor column 110 may include a semiconductor epitaxial layer. The semiconductor epitaxial layer may be, for example, a semiconductor thin film having a single crystal structure.

A gate electrode 120 may be provided on the first sidewall 102 of the semiconductor column 110. For example, the gate electrode 120 may extend transverse to the semiconductor column 110 such that the gate electrode 120 and the semiconductor column 110. A gate insulation layer 115 may be disposed between the first sidewall 102 of the semiconductor column 110 and the gate electrode 120. For example, the gate insulation layer 115 may be disposed at a section where the semiconductor column 110 and the gate electrode 120 cross. The gate insulation layer 115 may extend along the semiconductor column 110 and/or the gate electrode 120.

A control gate electrode 140 may be disposed on the second sidewall 104 of the semiconductor column 110. For example, the control gate electrode 140 may be opposite to the gate electrode 120 in view of the semiconductor column 110. The control gate electrode 140 may extend across the semiconductor column 110 and be orthogonal to the semiconductor column 110. For example, the control gate electrode 140 may extend parallel to the gate electrode 120.

A charge storage layer 130 may be disposed between the second sidewall 104 of the semiconductor column 110 and the control gate electrode 140. A tunneling insulation layer 125 may be disposed between the second sidewall 104 of the semiconductor column 110 and the charge storage layer 130. A blocking insulation layer 135 may be disposed between the charge storage layer 130 and the control gate electrode 140. For example, the tunneling insulation layer 125, the charge storage layer 130, and the blocking insulation layer 135 may be disposed at a section where the semiconductor column 110 and the control gate electrode 140 cross and may extend along the semiconductor column 110 and/or the control gate electrode 140.

The charge storage layer 130 may include, for example, a floating type charge storage layer or a trap type charge storage layer according to a charge storage type. If a floating type charge storage layer, the charge storage layer 130 may include a conductive material, for example, a metal or polysilicon. If a trap type charge storage layer, the charge storage layer 130 may include a silicon nitride layer, a quantum dot, or a nanocrystal. The quantum dot or nanocrystal may include a conductive material, for example, metal or semiconductor fine particles.

The tunneling insulation layer 125 may be used to support a tunneling path for charges between the semiconductor column 110 and the charge storage layer 130. The blocking insulation layer 135 may prevent charge from moving between the charge storage layer 130 and the control gate electrode 140. The tunneling insulation layer 125 and the blocking insulation layer 135 may have a stacked structure of appropriate insulation materials, for example, one or more materials selected from a group including oxide, nitride, and high-k materials. The high-k materials may have a dielectric constant greater than the oxide and the nitride materials.

The semiconductor column 110 may be appropriately thin such that both the control gate electrode 140 and the gate electrode 120 can commonly control a channel region of the semiconductor column 110, i.e., the gate electrode 120 may be used to form an inversion area serving as a channel in the semiconductor column 110. The voltage applied to the control gate electrode 140 can be greatly reduced during the operation of the non-volatile memory device, thereby greatly reducing a voltage stress applied to changes of the charge storage layer 130. Thus, reliability of charge storage in the charges storage layer 130 may be increased.

Figure 3:
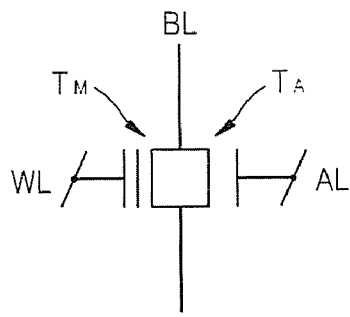
FIG. 3 is an equivalent circuit diagram of the non-volatile memory device shown in FIG. 1 according to some embodiments of the present invention.

FIG. 3 is an equivalent circuit diagram of the non-volatile memory device shown in FIG. 1 according to some embodiments of the present invention. Referring to FIGS. 1 through 3, the semiconductor column 110 may be coupled to a bit line BL. The semiconductor column 110 and the stack structure on the first sidewall 102 may form an auxiliary transistor $T_A$. For example, the auxiliary transistor $T_A$ may be a MOS transistor. The semiconductor column 110 and the stack structure on the second sidewall 104 may form a memory cell $T_M$. The memory cell $T_M$ may be a unit cell of a charge based non-volatile memory device, for example, a flash memory device. The gate electrode 120 of the auxiliary transistor $T_A$ may be coupled to an auxiliary line AL. The control gate electrode 140 of the memory cell $T_M$ may be coupled to a word line WL. If any one of the auxiliary transistor $T_A$ and the memory cell $T_M$ is turned on, a channel for charge transfer may be formed in a channel region of the semiconductor column 110. Thus, the auxiliary transistor $T_A$ and the memory cell $T_M$ share the channel region.

Figure 4:
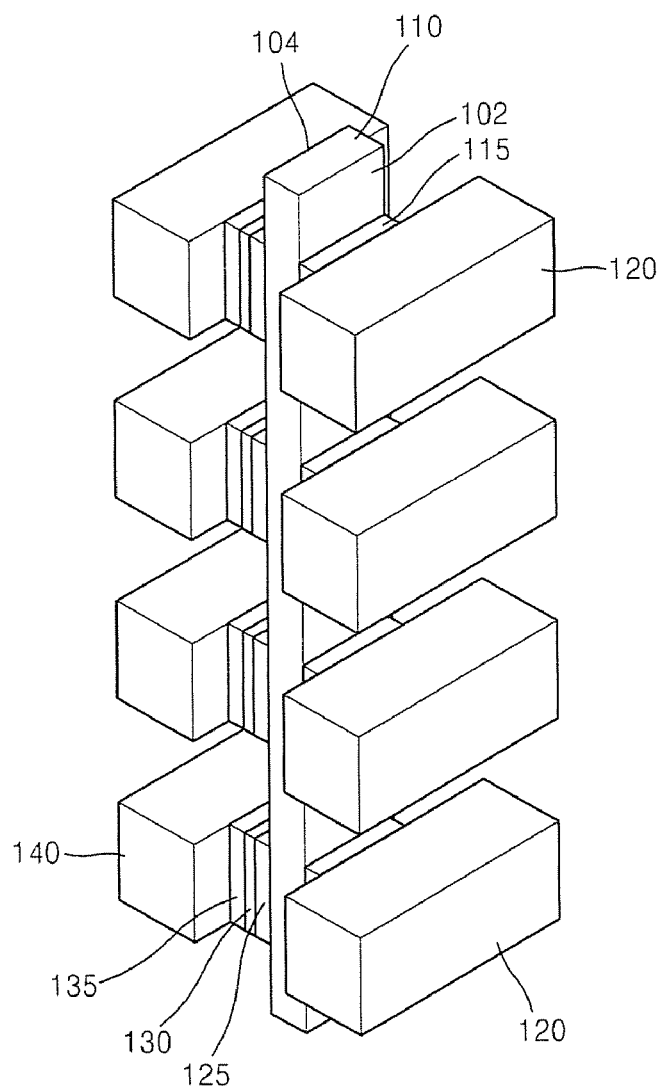
FIG. 4 is a perspective view of a non-volatile memory device according to further embodiments of the present invention.

FIG. 4 is a perspective view of a non-volatile memory device according to further embodiments of the present invention. The non-volatile memory device of the illustrated embodiments is a modification of the non-volatile memory device shown in FIGS. 1 through 3, with like components indicated by like reference designators.

Referring to FIG. 4, a plurality of gate electrodes 120 may be disposed on the first sidewall 102 of the semiconductor column 110. For example, the gate electrodes 120 may be spaced apart on the first sidewall 102 along the semiconductor column 110. Respective gate insulation layers 115 may be disposed between the semiconductor column 110 and the respective gate electrodes 120. Alternatively, a continuous gate insulation layer may extend along the semiconductor column 110 between the gate electrodes 120 and the column 110.

A plurality of control gate electrodes 140 may be disposed on the second sidewall 104 of the semiconductor column 110. For example, the control gate electrodes 140 may be spaced apart on the second sidewall 104 along the semiconductor column 110 on an opposite side of the column 110 with respect to the gate electrodes 120. Respective stacked structures, each including a tunneling insulation layer 125, a charge storage layer 130, and a blocking insulation layer 135, may be disposed between the semiconductor column 110 and the respective control gate electrodes 140. Alternatively, a continuous stacked structure including a tunneling insulation layer 125, a charge storage layer 130, and a blocking insulation layer 135 may extend along the semiconductor column 110 between the control gate electrodes 140 and the column 110. The number of the gate electrodes 120 and the control gate electrodes 140 may be appropriately determined according to the desired capacity of the non-volatile memory device.

Figure 5:
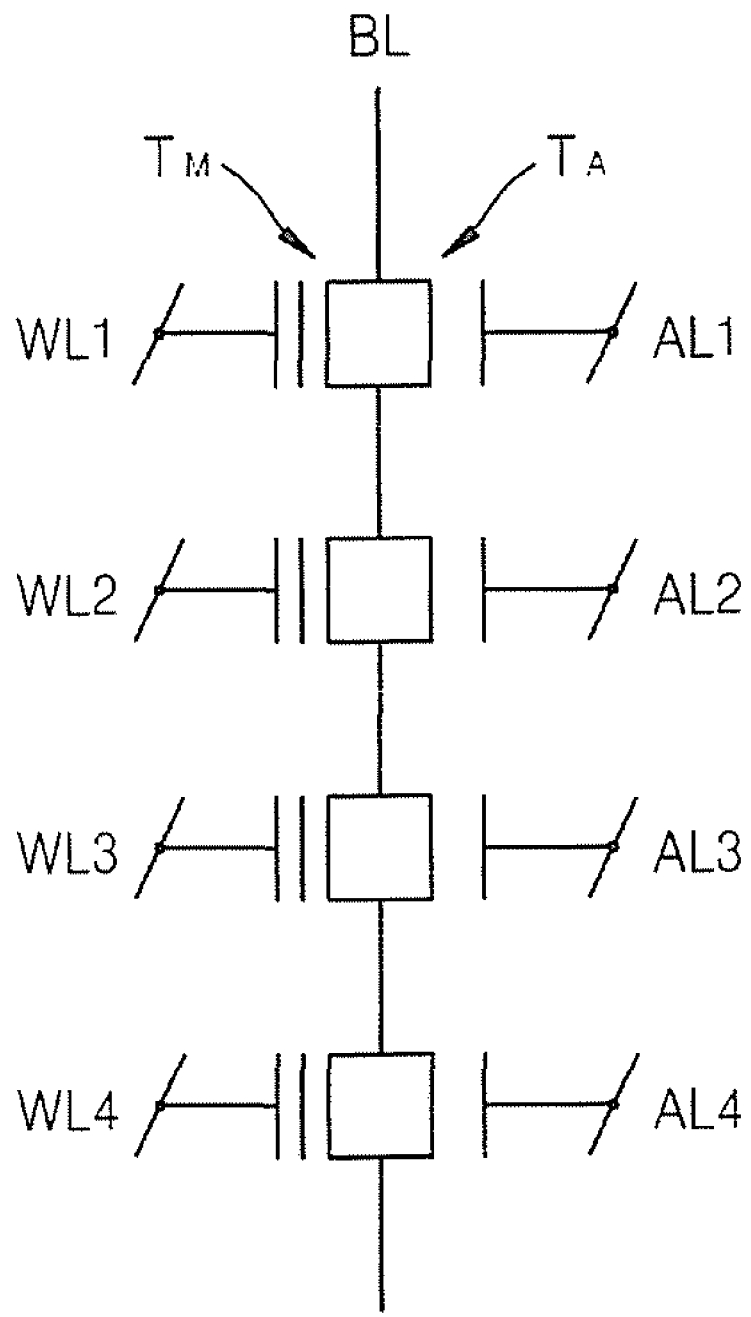
FIG. 5 is an equivalent circuit diagram of the non-volatile memory device shown in FIG. 4 according to some embodiments of the present invention.

FIG. 5 is an equivalent circuit diagram of the non-volatile memory device shown in FIG. 4 according to some embodiments of the present invention. Referring to FIGS. 4 and 5, a plurality of auxiliary transistors $T_A$ may be disposed on the first sidewall 102 of the semiconductor column 110. A plurality of memory cells $T_M$ may be disposed on an opposite second sidewall 104 of the semiconductor column 110. Respective auxiliary lines AL1, AL2, AL3, and AL4 may be coupled to respective ones of the gate electrodes 120 of the auxiliary transistors $T_A$. Respective word lines WL1, WL2, WL3, and WL4 may be coupled to respective ones of the control gate electrodes 140 of the memory cells $T_M$. The memory cells $T_M$ may form a NAND structure. A signal of the bit line BL may be controlled by the auxiliary transistors $T_A$ and the memory cells $T_M$ as well.

Figure 6:
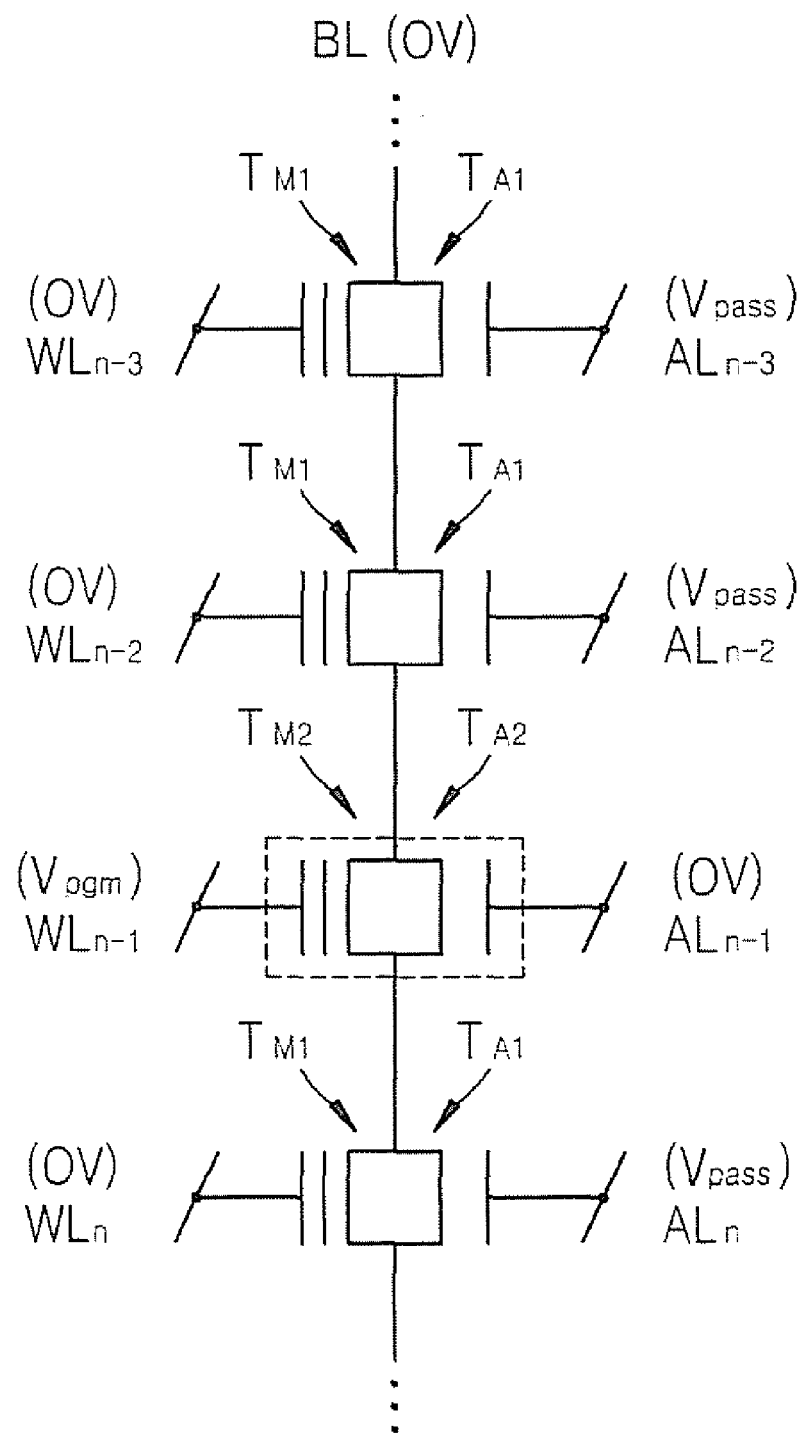
FIG. 6 is a circuit diagram for illustrating programming of a non-volatile memory device according to some embodiments of the present invention.
Figure 7:
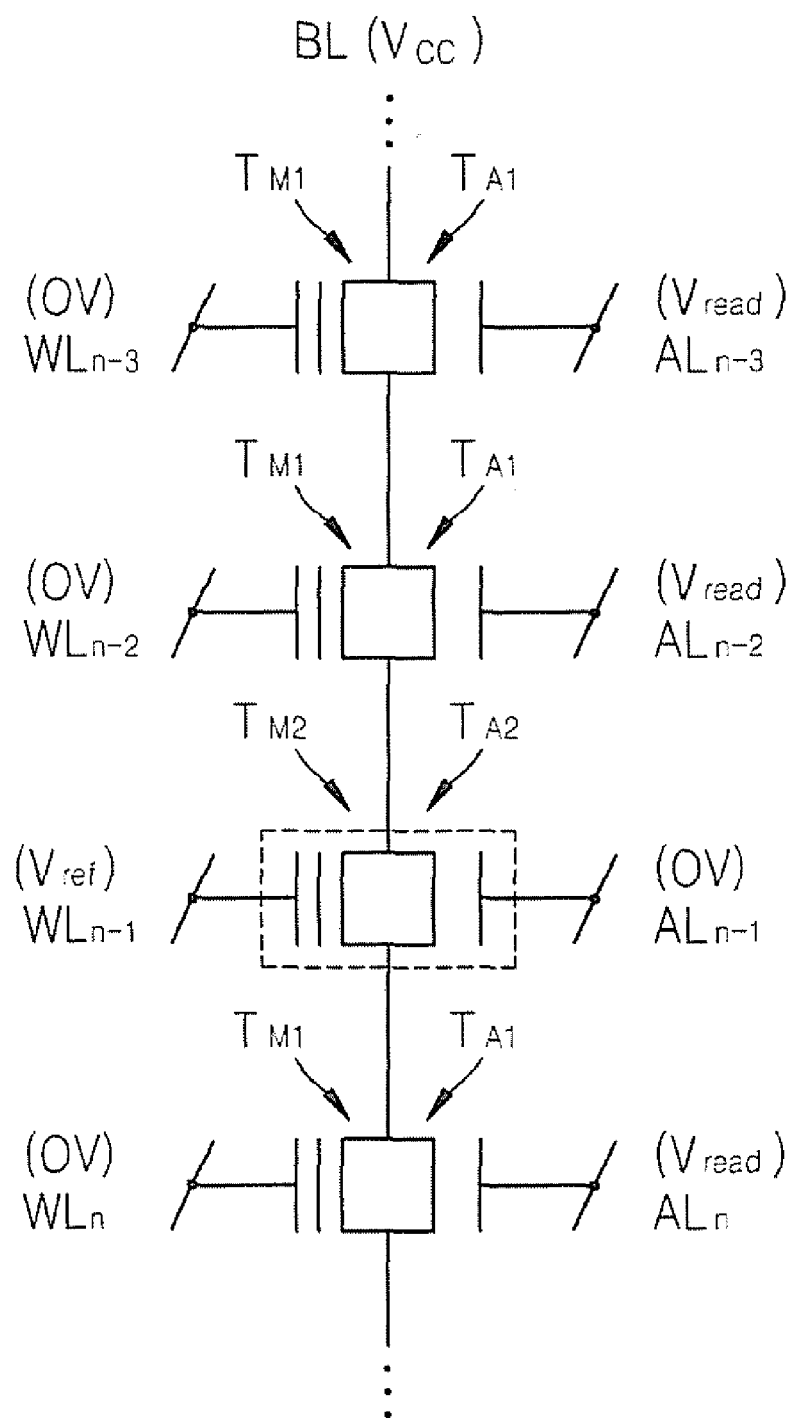
FIG. 7 is a circuit diagram for illustrating reading of a non-volatile memory device according to some embodiments of the present invention.

Methods of operating the non-volatile memory devices according to further embodiments of the invention will now be described hereinafter. FIG. 6 is a circuit diagram illustrating programming operations of a non-volatile memory device according to some embodiments of the present invention. FIG. 7 is a circuit diagram illustrating reading operations of a non-volatile memory device according to some embodiments of the present invention.

Table 1 includes operation conditions of the non-volatile memory device.

TABLE 1

|  | Programming | Reading | Erasing |
| --- | --- | --- | --- |
| SEL_WL | $V_{pgm}$ | $V_{ref}$ | 0 V |
| USL_WL | 0 V/FT | 0 V/FT | 0 V |
| SEL_AL | 0 V/FT | 0 V/FT | FT |
| USL_AL | $V_{pass}$ | $V_{read}$ | FT |
| BL | 0 V | $V_{cc}$ | FT |
| BD | 0 V | 0 V | $V_{ers}$ |

A selected word line SEL_WL is one selected from among a plurality of word lines . . . WLn-3, WLn-2, WLn-1, WLn, . . . . A plurality of non-selected word lines USL_WL are the word lines . . . WLn-3, WLn-2, WLn-1, WLn, . . . , excluding the selected word line SEL_WL. A selected auxiliary line SEL_AL is one auxiliary line selected from among a plurality of auxiliary lines . . . ALn-3, ALn-2, ALn-1, ALn, . . . . A plurality of non-selected auxiliary lines USL_AL are the auxiliary lines . . . ALn-3, ALn-2, ALn-1, ALn, . . . , excluding the selected auxiliary line SEL_AL. The selected word line SEL_WL and the selected auxiliary line SEL_AL may be lines opposite one another. A body BD is a body of the memory cells $T_M$, and may correspond to the semiconductor column 110 shown in FIG. 4.

In FIGS. 6 and 7, the word line WLn-1 is the selected word line SEL_WL, and the auxiliary line ALn-1 is the selected auxiliary line SEL_AL. Therefore, the selected word line SEL_WL is coupled to a selected memory cell $T_{M2}$, and the selected auxiliary line SEL_AL is coupled to a selected auxiliary transistor $T_{A2}$. The selected memory cell $T_{M2}$ and the selected auxiliary transistor $T_{A2}$ may be disposed opposite one other. The non-selected word lines USL_WL may be coupled to a plurality of non-selected memory cells $T_{M1}$, and the non-selected auxiliary lines USL_AL may be coupled to a plurality of non-selected auxiliary transistors $T_{A1}$.

For example, in a programming operation, data may be provided to the selected memory cell $T_{M2}$. During the programming operation, a program voltage $V_{pgm}$ may be applied to the selected word line SEL_WL, and a pass voltage $V_{pass}$ may be applied to the non-selected auxiliary lines USL_AL. The bit line BL, the non-selected word lines USL_WL, and the selected auxiliary line SEL_AL may be grounded ("0V") or may be floated ("FT").

As shown in FIG. 6, during the programming operation, the non-selected memory cells $T_{M1}$ and the selected auxiliary transistor $T_{A2}$ are turned off, whereas the non-selected auxiliary transistors $T_{A1}$ are turned on. Charge may be injected into the selected memory cell $T_{M2}$ by F-N tunnelling. Therefore, a channel (or an inversion area) may be formed in the semiconductor column 110 of FIG. 4 under the non-selected memory cells $T_{M1}$ while voltage stress is not given to the selected memory cell $T_{M2}$, which may prevent a program disturbance caused by a fluctuation of charges stored in the non-selected memory cells $T_{M1}$ during the programming operation.

In a read operation, data may be read from a selected memory cell $T_{M2}$. During the read operation, an operation voltage $V_{cc}$ may be applied to the bit line BL, a reference voltage $V_{ref}$ may be applied to the selected word line SEL_WL, and a read voltage $V_{read}$ may be applied to the non-selected auxiliary lines USL_AL. The non-selected word lines USL_WL and the selected auxiliary line SEL_AL may be grounded ("0V") or floated ("FT"). The read voltage $V_{read}$ may be sufficient to turn on the non-selected auxiliary transistors $T_{A1}$ and may be smaller than the pass voltage $V_{pass}$.

As shown in FIG. 7, during the read operation, the non-selected memory cells $T_{M1}$ and the selected auxiliary transistor $T_{A2}$ are turned off, whereas the non-selected auxiliary transistors $T_{A1}$ are turned on. The selected memory cell $T_{M2}$ is turned on or off according to the amount of charge stored therein. Therefore, the channel (or the inversion area) may be formed in the semiconductor column 110 of FIG. 4 under the non-selected memory cells $T_{M1}$ while voltage stress is not applied to the non-selected memory cells $T_{M1}$, which may prevent a reading disturbance caused by a fluctuation of charges stored in the non-selected memory cells $T_{M1}$ during the read operation.

An erase operation for the memory cells $T_{M1}$ and $T_{M2}$ may be provided according to further embodiments of the present invention. During the erase operation, the selected word line SEL_WL and the non-selected word lines USL_WL may be grounded ("0V"), and an erase voltage $V_{ers}$ may be applied to the body BD. The selected auxiliary line SEL_AL and the non-selected auxiliary lines USL_AL may be floated ("FT").

Figure 8:
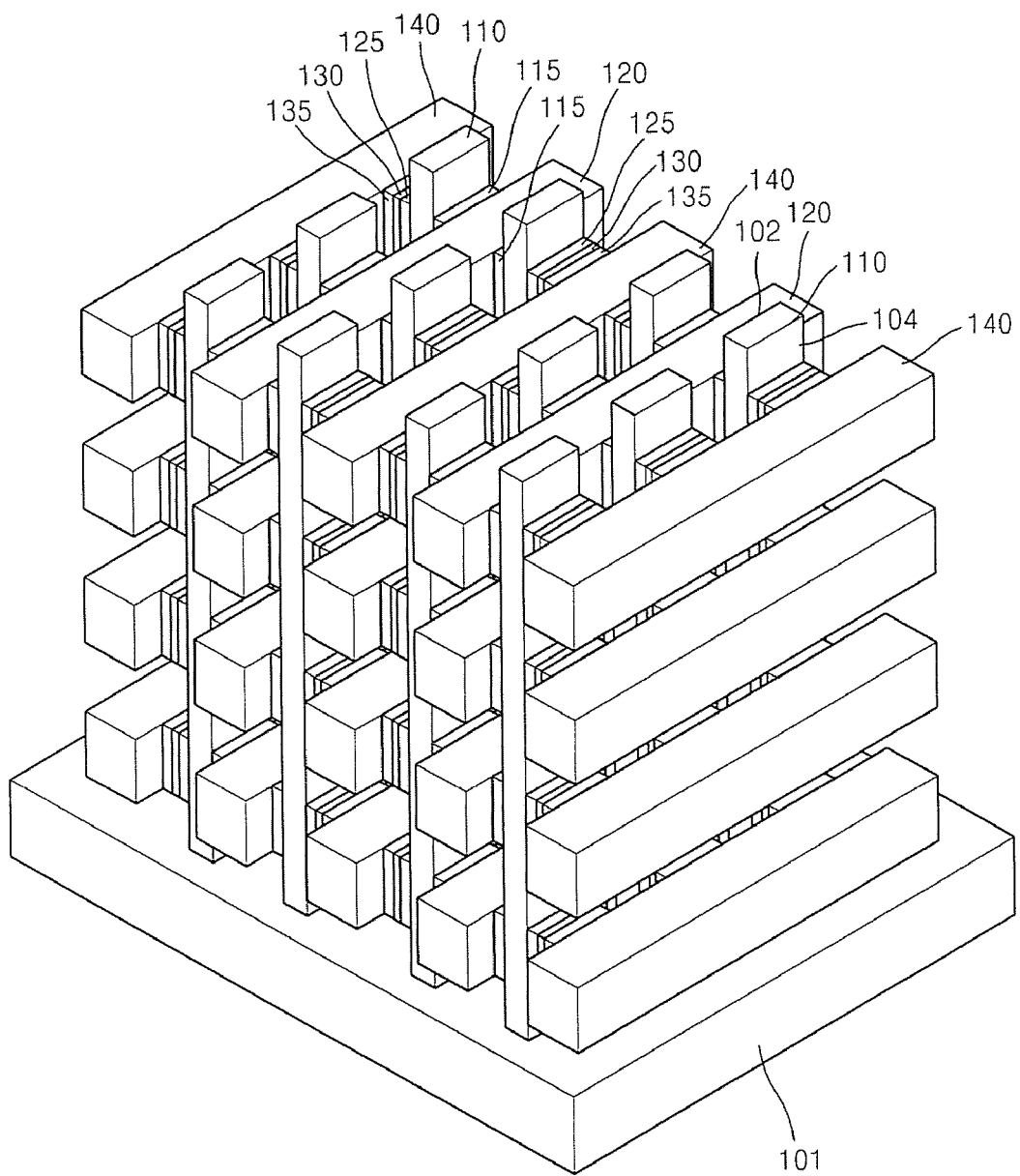
FIG. 8 is a perspective view of a non-volatile memory device according to further embodiments of the present invention.

FIG. 8 is a perspective view of a non-volatile memory device according to further embodiments of the present invention. The non-volatile memory device of the illustrated embodiments is a modification of the non-volatile memory device shown FIG. 4, with like components indicated by like reference designators.

Referring to FIG. 8, a plurality of semiconductor columns 110 may be arranged as a plurality of parallel rows of semiconductor columns 110. Gate electrodes 120 may be disposed on first sidewalls 102 of the semiconductor columns 110. Control gate electrodes 140 may be disposed on second sidewalls 104 of the semiconductor columns 110. The gate electrodes 120 and the control gate electrodes 140 may be spaced apart on the first sidewalls 102 and the second sidewalls 104 and may extend transverse to the semiconductor columns 110. Therefore, the gate electrodes 120 and the control gate electrodes 140 may be arrayed in a three-dimensional manner.

The semiconductor columns 110 in a given row may be disposed such that the first sidewalls 102 face each other and the second sidewalls 104 face one another. The semiconductor column 110 in a given column may be disposed apart between the gate electrodes 120 and the control gate electrodes 140.

In the illustrated embodiments, the number of the semiconductor column 110, the number of gate electrodes 120 and the control gate electrodes 140 may be appropriately determined according to the desired capacity of the non-volatile memory device.

The semiconductor columns 110 may extend perpendicularly to a substrate 101. A plurality of strings having a NAND structure may extend perpendicularly to the substrate 101. However, the present embodiment is not limited thereto. The semiconductor columns 110 may, for example, be parallel to the substrate 101.

Figure 9:
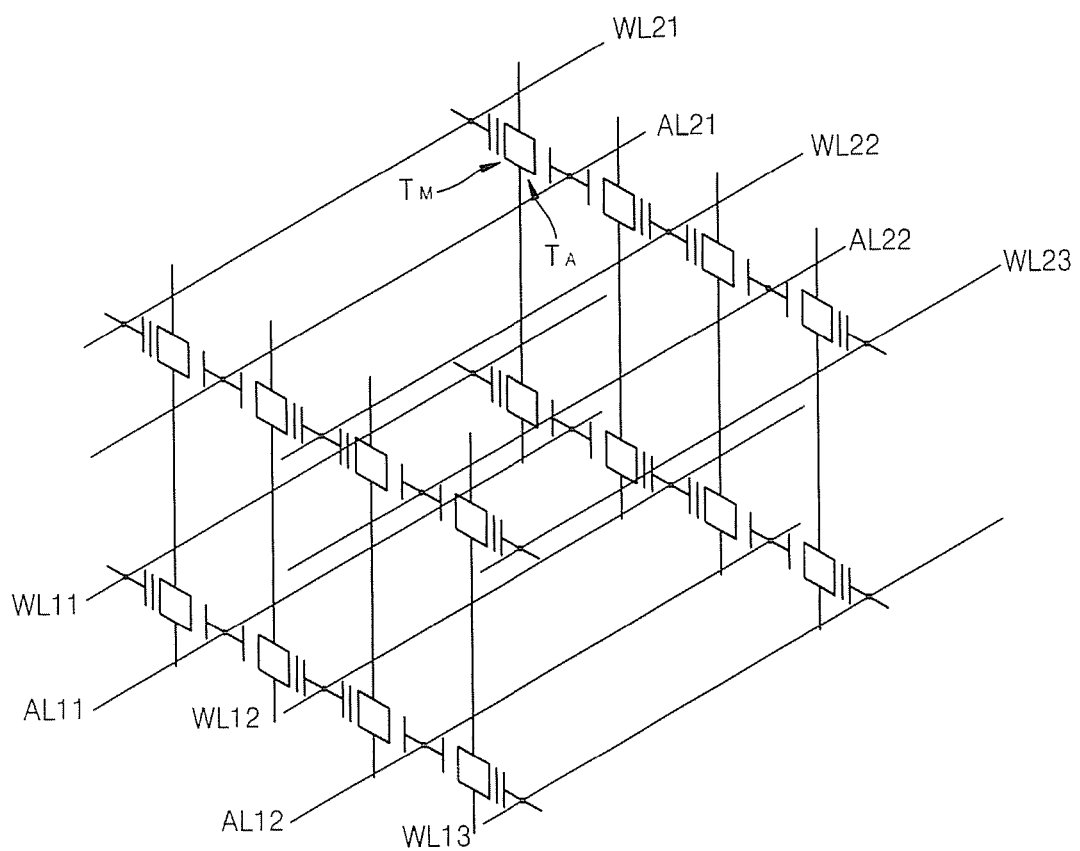
FIG. 9 is an equivalent circuit diagram of a part of the non-volatile memory device shown in FIG. 8 according to some embodiments of the present invention.

FIG. 9 is an equivalent circuit diagram of a part of the non-volatile memory device shown in FIG. 8 according to some embodiments of the present invention. The illustrated example is a 2-layered and 2-row structure, i.e., a 4×2×2 structure.

Referring to FIGS. 8 and 9, memory cells $T_M$ and the auxiliary transistors $T_A$ may be arrayed in a three-dimensional manner. The memory cells $T_M$ of a first layer may be coupled to word lines WL11, WL12, and WL13, and the auxiliary transistors $T_A$ of the first layer may be coupled to auxiliary lines AL11 and AL12. The memory cells $T_M$ of a second layer may be coupled to word lines WL21, WL22, and WL23, and the auxiliary transistors $T_A$ of the second layer may be coupled to auxiliary lines AL21 and AL22. The memory cells $T_M$ of the first and second layers may have a NAND structure.

Figure 10:
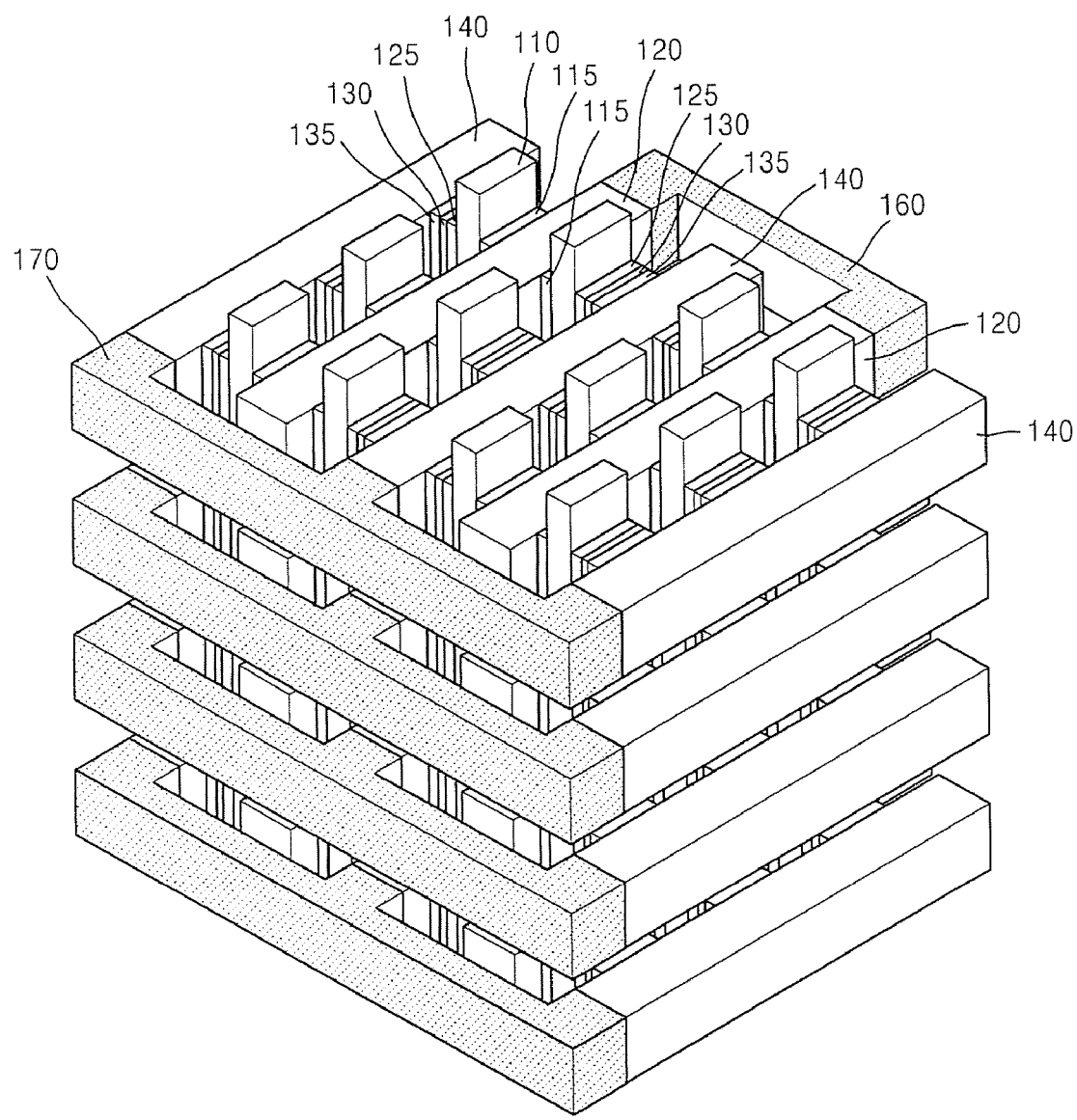
FIG. 10 is a perspective view of a non-volatile memory device according to further embodiments of the present invention.

FIG. 10 is a perspective view of a non-volatile memory device according to further embodiments of the present invention. The non-volatile memory device of the illustrated embodiments is a modification of the non-volatile memory device shown FIG. 8, with like components indicated by like reference designators.

Referring to FIG. 10, the gate electrodes 120 of each layer may be coupled to a common gate line 160 for each layer. The control gate electrodes 140 of each layer may be coupled to a common control gate line 170 for each layer. Although the gate electrodes 120 of each layer may be coupled to each other and the common control gate line 170 of each layer may be coupled to each other, the semiconductor columns 110 may be separated from each other and selected, and thus memory cells may be separated from each other and operated.

Figure 11:
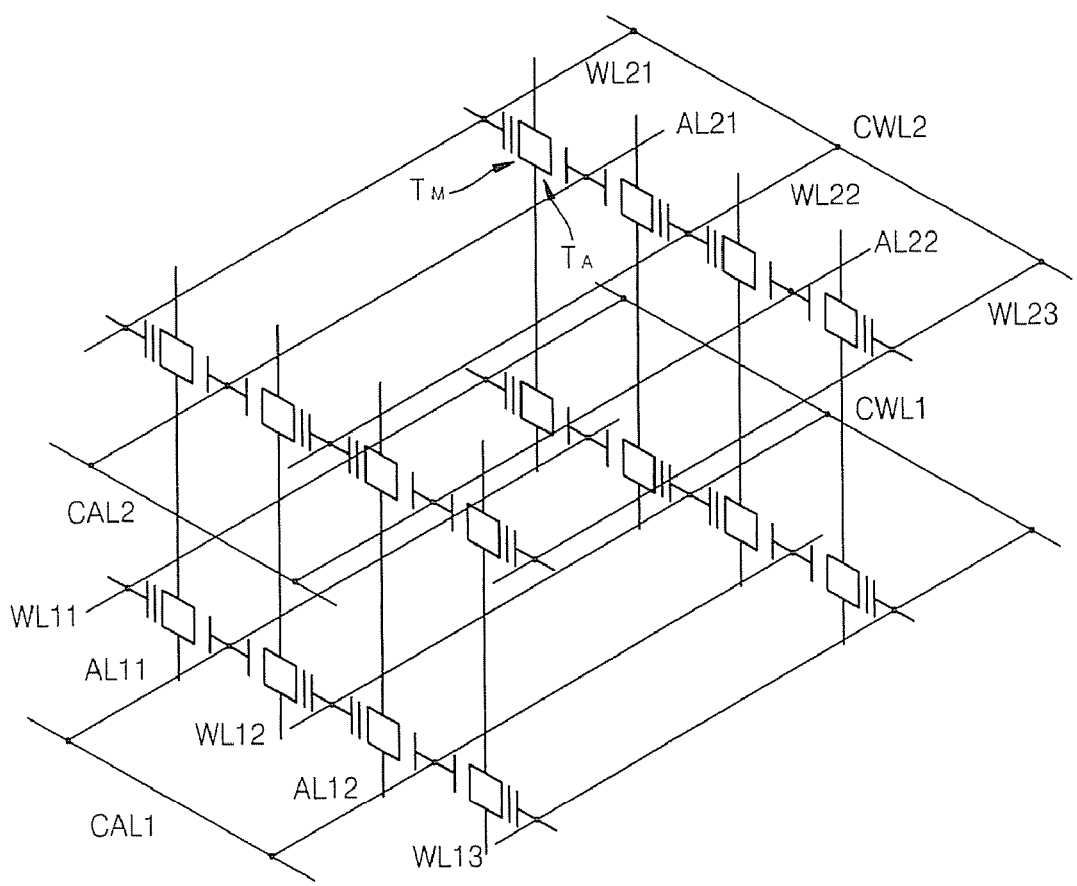
FIG. 11 is an equivalent circuit diagram of a part of the non-volatile memory device shown in FIG. 10 according to some embodiments of the present invention.

FIG. 11 is an equivalent circuit diagram of a part of the non-volatile memory device shown in FIG. 10 according to some embodiments of the present invention. Referring to FIG. 11, the word lines WL11, WL12, and WL13 may be coupled to a common word line CWL1, and the word lines WL21, WL22, and WL23 may be coupled to a common word line CWL2. The auxiliary lines AL11 and AL12 may be coupled to a common auxiliary line CAL1, and the auxiliary lines AL21 and AL22 may be coupled to a common auxiliary line CAL2.

Figure 12:
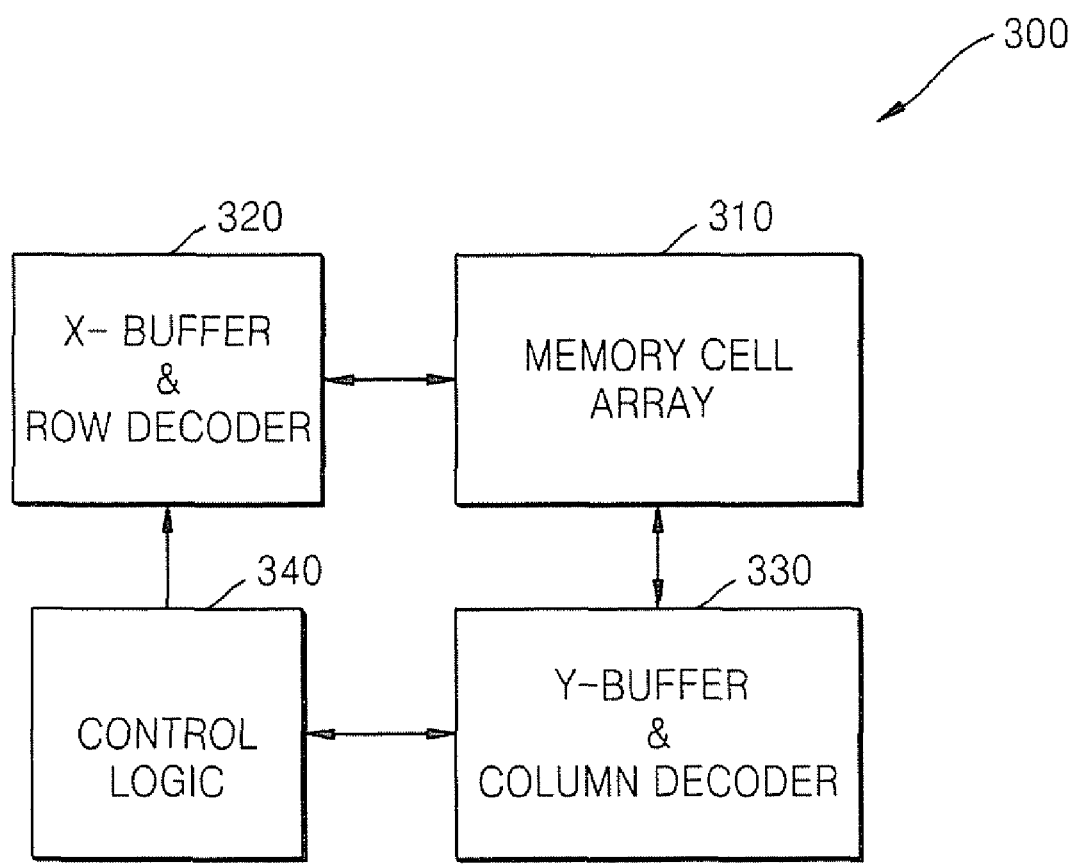
FIG. 12 is a block diagram of a memory chip according to some embodiments of the present invention.

FIG. 12 is a block diagram of a memory chip 300 according to some embodiments of the present invention. Referring to FIG. 12, a memory cell array 310 may have any of the structures shown in FIGS. 1 through 11. The memory cell array 310 may be coupled to an X-buffer & row decoder 320 and a Y-buffer & column decoder 330. For example, word lines of the memory cell array 310 may be coupled to the X-buffer & row decoder 320 and bit lines of the memory cell array 310 may be coupled to the Y-buffer & column decoder 330. Control logic 340 may be coupled to the X-buffer & row decoder 320 and the Y-buffer & column decoder 330 so as to control them.

Figure 13:
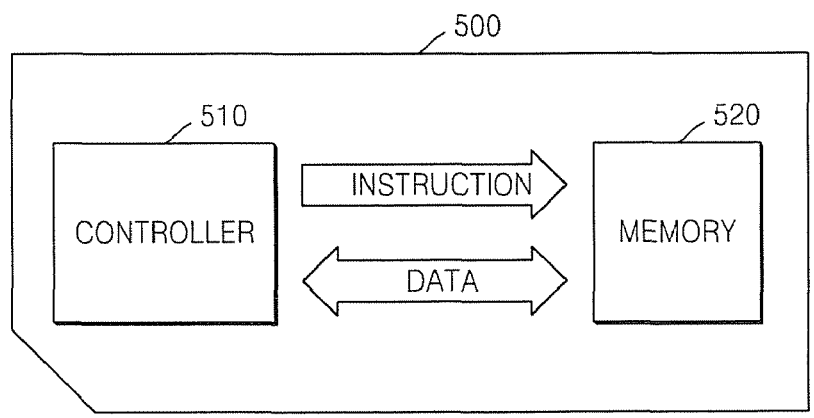
FIG. 13 is a block diagram of a memory card according to some embodiments of the present invention.

FIG. 13 is a block diagram of a memory card 500 according to some embodiments of the present invention. Referring to FIG. 13, a controller 510 and a memory 520 may communicate with one another. For example, the controller 510 and the memory 520 may communicate data according to an instruction of the controller 510, so that the memory card 500 can store data in the memory 520 or output data from the memory 520. For example, the memory 520 may include the semiconductor chip 300 shown in FIG. 12. The memory card 500 may be used as a data storage medium of various types of portable devices. For example, the memory card 500 may be a multimedia card (MMC) or a secure digital card (SD).

Figure 14:
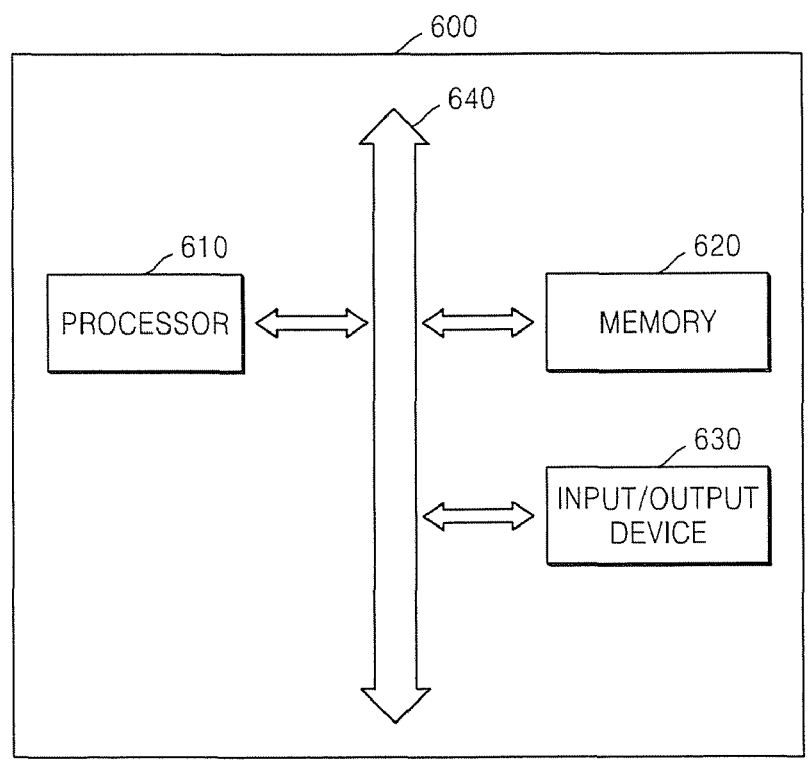
FIG. 14 is a block diagram of an electronic system according to some embodiments of the present invention.

FIG. 14 is a block diagram of an electronic system 600 according to some embodiments of the present invention. Referring to FIG. 14, a processor 510, an input/output device 630, and a memory 620 may communicate data by using a bus 640. The processor 610 may execute a program and control the electronic system 600. The input/output device 630 may be used to input or output the data of the electronic system 600. The electronic system 600 may be connected to an external device, for example, a PC or a network, and communicate with the external device by using the input/output device 630. The memory 620 may store a code used to operate the processor 610 and the data. For example, the memory 620 may include the semiconductor chip 300 shown in FIG. 12. For example, the electronic system 600 may be various types of electronic control devices requiring the memory 620, and be used as, for example, a mobile phone, an MP3 player, a navigation device, a solid state disk (SSD), or a household appliance.

Many different embodiments have been disclosed herein, in connection with the above description and the drawings. It will be understood that it would be unduly repetitious and obfuscating to literally describe and illustrate every combination and subcombination of these embodiments. Accordingly, the present specification, including the drawings, shall be construed to constitute a complete written description of all combinations and subcombinations of the embodiments described herein, and of the manner and process of making and using them, and shall support claims to any such combination or subcombination.

In the drawings and specification, there have been disclosed embodiments of the invention and, although specific terms are employed, they are used in a generic and descriptive sense only and not for purposes of limitation, the scope of the invention being set forth in the following claims.

What is claimed is:

1. A non-volatile memory device comprising:
    at least one semiconductor column having a first sidewall and a second sidewall;
    at least one gate electrode disposed on the first sidewall;
    at least one control gate electrode disposed on the second sidewall; and
    at least one charge storage layer disposed between the second sidewall and the at least one control gate electrode.

2. The non-volatile memory device of claim 1, wherein the at least one gate electrode and the at least one control gate electrode are disposed on opposite sides of the at least one semiconductor column such that they commonly control a channel region in the semiconductor column.

3. The non-volatile memory device of claim 1, wherein the at least one charge storage layer is positioned at a location where the at least one semiconductor column and the at least one control gate electrode cross.

4. The non-volatile memory device of claim 1, further comprising:
at least one tunneling insulation layer disposed between the second sidewall and the at least one charge storage layer; and
at least one blocking insulation layer disposed between the at least one charge storage layer and the at least one control gate electrode.

5. The non-volatile memory device of claim 1, further comprising at least one gate insulation layer disposed between the first sidewall of the at least one semiconductor column and the at least one gate electrode.

6. The non-volatile memory device of claim 1, wherein the at least one gate electrode comprises a plurality of gate electrodes that are spaced apart on the first sidewall of the at least one semiconductor column.

7. The non-volatile memory device of claim 6, wherein the at least one control gate electrode comprises a plurality of control gate electrodes that are spaced apart on the second sidewall of the at least one semiconductor column.

8. The non-volatile memory device of claim 1:
wherein the at least one semiconductor column comprises at least one row of semiconductor columns, each semiconductor column having a first sidewall and a second sidewall on opposite sides thereof:
wherein the at least one gate electrode comprises at least one gate electrode disposed on the first sidewalls;
wherein the at least one control gate electrode comprises at least one control gate electrode disposed on the second sidewalls; and
wherein the at least one row of semiconductor columns disposed between the at least one gate electrode and the at least one control gate electrode.

9. The non-volatile memory device of claim 8:
wherein the at least one row of semiconductor columns comprises a plurality of parallel rows of semiconductor columns;
wherein the at least one gate electrode comprises respective gate electrodes disposed on the first sidewalls of respective ones of the rows of semiconductor columns; and
wherein the at least one control gate electrode comprises respective control gate electrodes disposed on the second sidewalls of respective ones of the rows of semiconductor columns.

10. The non-volatile memory device of claim 9, wherein adjacent ones of the rows of semiconductor columns share a gate electrode and/or a control gate electrode.

11. The non-volatile memory device of claim 9, wherein multiple levels of gate electrodes and control gate electrodes are disposed on the first and second sidewalls of each of the rows of semiconductor columns.

12. The non-volatile memory device of claim 11, further comprising:
a common gate line coupled in common to gate electrodes of multiple ones of the rows of semiconductor columns; and
a common control gate line coupled in common to control gate electrodes of multiple rows of the semiconductor columns.

13. A non-volatile memory device comprising:
at least one semiconductor column having a first sidewall and a second sidewall;
a plurality of auxiliary transistors comprising respective gate electrodes disposed on the first sidewalls of the at least one semiconductor column and configured to control respective channel regions of the at least one semiconductor column;
a plurality of memory cells comprising respective control gate electrodes and charge storage regions disposed on the second sidewalls, wherein the control gate electrodes of respective ones of the plurality of memory cells share control of respective ones of the channel regions controlled by gate electrodes of corresponding respective ones of the auxiliary transistors;
a plurality of auxiliary lines, respective ones of which are coupled to the gate electrodes of the plurality of auxiliary transistors; and
a plurality of word lines, respective ones of which are coupled to the control gate electrodes of the plurality of memory cells.

14. The non-volatile memory device of claim 13, wherein the plurality of memory cells are connected in a NAND arrangement.

15. The non-volatile memory device of claim 13, wherein each of the plurality of memory cells comprises:
a tunneling insulation layer disposed on the at least one semiconductor column;
a charge storage layer disposed on the tunneling insulation layer;
a blocking insulation layer disposed on the charge storage layer; and
a control gate electrode disposed on the blocking insulation layer.

16. A method of operating the non-volatile memory device of claim 13, the method comprising:
programming a selected one of the plurality of memory cells by applying a program voltage to a control gate electrode of the selected one of the plurality of memory cells while non-selected ones of the plurality of memory cells are turned off and the respective auxiliary transistors corresponding to the non-selected memory cells are turned on.

17. The method of claim 16, wherein the auxiliary transistor corresponding to the selected memory cell is turned off while the programming voltage is applied to the control gate electrode of the selected one of the plurality of memory cells.

18. The method of claim 16, further comprising:
reading data from the selected one of the plurality of memory cells by applying a reference voltage to a control gate electrode of the selected one of the plurality of memory cells while non-selected ones of the plurality of memory cells are turned off and the auxiliary transistors corresponding to the non-selected ones of the plurality memory cells are turned on.

19. The method of claim 18, wherein the auxiliary transistor corresponding to the selected memory cell is turned off while the reference voltage is applied to the control gate electrode of the selected one of the plurality of memory cells.

* * * * *